(12) United States Patent
Mui et al.

(10) Patent No.: US 12,467,147 B2
(45) Date of Patent: Nov. 11, 2025

(54) VAPOR CLEANING OF SUBSTRATE SURFACES

(71) Applicant: LAM RESEARCH CORPORATION, Fremont, CA (US)

(72) Inventors: David Mui, Fremont, CA (US); Gerome Michel Dominique Melaet, San Leandro, CA (US); Nathan Musselwhite, San Jose, CA (US); Michael Ravkin, Los Altos, CA (US); Mark Kawaguchi, San Carlos, CA (US); Ilia Kalinovski, Berkeley, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 911 days.

(21) Appl. No.: 17/621,283

(22) PCT Filed: Jun. 23, 2020

(86) PCT No.: PCT/US2020/039039
§ 371 (c)(1),
(2) Date: Dec. 21, 2021

(87) PCT Pub. No.: WO2020/263766
PCT Pub. Date: Dec. 30, 2020

(65) Prior Publication Data
US 2022/0356585 A1 Nov. 10, 2022

Related U.S. Application Data

(60) Provisional application No. 62/865,647, filed on Jun. 24, 2019.

(51) Int. Cl.
*B08B 5/00* (2006.01)
*C23F 1/08* (2006.01)
(Continued)

(52) U.S. Cl.
CPC . *C23F 1/12* (2013.01); *C23F 1/08* (2013.01)

(58) Field of Classification Search
CPC . B08B 5/00; H01L 21/02; H01L 21/67; C23F 1/08; C23F 1/12
See application file for complete search history.

(56) References Cited

U.S. PATENT DOCUMENTS 5,094,701 A 3/1992 Norman et al.
5,213,621 A 5/1993 Ivankovits et al.
(Continued)

FOREIGN PATENT DOCUMENTS

CN 107710395 A 2/2018
JP S6469014 A 3/1989
(Continued)

OTHER PUBLICATIONS

Japanese Office Action and Search Report for Japanese Application No. 2021576543 dated Jun. 17, 2024.
(Continued)

*Primary Examiner* — Brian P Mruk

(57) ABSTRACT

A method for cleaning a substrate includes arranging the substrate in a processing chamber; controlling a pressure of the processing chamber to a predetermined pressure range; controlling a temperature of the processing chamber to a predetermined temperature range; and supplying a vapor mixture including a metal chelating vapor for a first period to remove metal contamination from surfaces of the substrate.

12 Claims, 4 Drawing Sheets

(51) Int. Cl.
*C23F 1/12* (2006.01)
*H01L 21/02* (2006.01)
*H01L 21/67* (2006.01)

(56) References Cited

U.S. PATENT DOCUMENTS

| | | | |
|---|---|---|---|
| 5,939,334 | A | 8/1999 | Nguyen et al. |
| 6,159,859 | A | 12/2000 | Robertson, III et al. |
| 7,718,590 | B2 | 5/2010 | Suzuki et al. |
| 2001/0009154 | A1* | 7/2001 | Nguyen .................. C23F 1/12 438/711 |
| 2002/0047144 | A1* | 4/2002 | Nguyen ............ H01L 21/76838 257/E21.309 |
| 2006/0175011 | A1 | 8/2006 | Shinriki et al. |
| 2012/0180811 | A1* | 7/2012 | Gunji .................. C23C 16/4405 134/2 |
| 2015/0047680 | A1 | 2/2015 | Umezaki et al. |
| 2016/0379854 | A1 | 12/2016 | Vopat et al. |
| 2018/0330923 | A1 | 11/2018 | Tran et al. |

FOREIGN PATENT DOCUMENTS

| | | |
|---|---|---|
| JP | H 05-163174 A | 6/1993 |
| JP | H 05-308065 A | 11/1993 |
| JP | H0610176 A | 1/1994 |
| JP | H 06-101076 A | 4/1994 |
| JP | H09260323 A | 10/1997 |
| JP | H 10-321594 A | 12/1998 |
| JP | H11140652 A | 5/1999 |
| JP | H 11-204491 A | 7/1999 |
| JP | 2000-058505 A | 2/2000 |
| JP | 2000-091290 A | 3/2000 |
| JP | 2001-168076 A | 6/2001 |
| JP | 2003-089875 A | 3/2003 |
| JP | 2005252234 A | 9/2005 |
| JP | 2008078618 A | 4/2008 |
| JP | 2011190490 A | 9/2011 |
| JP | 2017168781 A | 9/2017 |
| JP | 2018523305 A | 8/2018 |
| JP | 2018-190983 A | 11/2018 |
| KR | 19980087425 A | 12/1998 |
| KR | 20000005976 A | 1/2000 |
| KR | 100743299 B1 | 7/2007 |
| KR | 20140124858 A | 10/2014 |
| KR | 20180014436 A | 2/2018 |
| TW | 408385 B | 10/2000 |
| TW | 201701428 A | 1/2017 |
| WO | WO-2004006316 A1 | 1/2004 |
| WO | WO-2012052858 A1 | 4/2012 |

OTHER PUBLICATIONS

Korean Office Action for Korean Application No. 10-2022-7001964 mailed Jul. 10, 2024.
Taiwanese Office Action for Taiwanese Application No. 109121633 dated Feb. 23, 2024.
Chinese Office Action and Search Report for Chinese Application No. 202080046734.7 dated Sep. 7, 2024.
Japanese Decision to Grant a Patent for Japanese Application No. 2021-576543 dated Dec. 10, 2024.
International Search Report and Written Opinion of the ISA issued in PCT/US2020/039039, mailed Oct. 8, 2020; ISA/KR.
Chinese Office Action for Chinese Application No. 202080046734.7 dated May 30, 2025.

* cited by examiner

VAPOR CLEANING OF SUBSTRATE SURFACES

CROSS-REFERENCE TO RELATED APPLICATIONS

This application is a U.S. National Phase Application under 35 U.S.C. 371 of International Application No. PCT/US2020/039039, which claims the benefit of U.S. Provisional Application No. 62/865,647, filed on Jun. 24, 2019. The entire disclosures of the applications referenced above are incorporated herein by reference.

FIELD

The present disclosure relates to substrate processing systems, and more particularly to substrate processing systems for vapor cleaning of substrates such as semiconductor wafers.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat film on a substrate such as semiconductor wafers. Examples of treatments include etching, deposition, ashing and other types of treatments. During processing of the substrates, multiple treatments may be performed in one or more processing chambers. The substrate is typically cleaned between treatments to remove contamination from upstream processing chambers prior to further processing in downstream processing chambers.

Wet cleaning may be performed to clean the substrates. For example, the substrate may be mounted on a chuck. As the chuck is rotated, fluid nozzles may be used to dispense fluid such as a liquid and/or heat may be applied to treat the substrate.

Some of the substrates include high aspect ratio (HAR) structures. For example, the HAR structures may include nanopillars, trenches or vias. The HAR structures have a width (parallel to a surface of the substrate) that is significantly less than a depth (perpendicular to a surface of the substrate) of the feature. HAR structures having an aspect ratio greater than 5:1 are fairly common. More advanced processes include HAR structures having even higher aspect ratios.

Pattern collapse occurs when one or more of the HAR structures collapse, move laterally relative to a surface of the substrate and/or directly contact adjacent HAR structures. Pattern collapse is often encountered during drying after wet cleaning.

Pattern collapse can cause performance issues and defects.

SUMMARY

A method for cleaning a substrate includes arranging the substrate in a processing chamber; controlling a pressure of the processing chamber to a predetermined pressure range; controlling a temperature of the processing chamber to a predetermined temperature range; and supplying a vapor mixture including a metal chelating vapor for a first period to remove metal contamination from surfaces of the substrate.

In other features, at least one of: components that are located within the processing chamber are made of non-metallic materials; and/or exposed surfaces of the components that are located within the processing chamber are coated with a non-metallic coating.

In other features, the metal chelating vapor includes β-diketones and derivatives of β-diketones. The metal chelating vapor is selected from a group consisting of acetylacetone (acac), trifluoroacetylacetone (tfa), hexafluoroacetylacetone (hfacH), pivaloyltrifluoroacetone, tetramethylheptanedione and heptafluoro-dimethyl octanedione (fod).

In other features, the metal chelating vapor includes trifluoroacetic acid and ethylenediamine.

In other features, the vapor mixture further includes a vapor including hydrogen halides.

The method includes, after the first period, removing reactants from the processing chamber; supplying an oxidizing gas mixture to the processing chamber for a second period; and removing reactants from the processing chamber after the second period.

In other features, prior to supplying the vapor mixture to the processing chamber, the method includes supplying an oxidizing gas mixture to the processing chamber for a second period; and removing reactants from the processing chamber after the second period.

In other features, the predetermined pressure range is from 0.1 Torr to 100 Torr. The predetermined temperature from 50° C. to 300° C.

A substrate processing system for cleaning substrates includes a processing chamber including a top surface, a bottom surface, and side walls that are at least one of made of a non-metallic material and/or coated with a non-metallic material. A substrate support supports a substrate. A heater heats the substrate to a temperature in a predetermined range. A vapor delivery system supplies a vapor mixture including a metal chelating vapor to the processing chamber for a first period to remove metal contamination from surfaces of the substrate.

In other features, the metal chelating vapor includes β-diketones and derivatives of β-diketones. The metal chelating vapor includes acetylacetone (acac), trifluoroacetylacetone (tfa), pivaloyltrifluoroacetone, tetramethylheptanedione, hexafluoroacetylacetone (hfacH) and heptafluoro-dimethyl octanedione (fod). The metal chelating vapor includes trifluoroacetic acid and ethylenediamine.

In other features, the vapor mixture further includes a vapor including halogen species. A gas delivery system delivers an oxidizing gas mixture to the processing chamber after the first period for a second period. A gas delivery system delivers an oxidizing gas mixture to the processing chamber for a second period. The gas delivery system delivers the oxidizing gas mixture to the processing chamber prior to the vapor delivery system supplying the vapor mixture.

In other features, the processing chamber is maintained at a pressure in a predetermined pressure range from 0.1 Torr to 100 Torr. The predetermined temperature from 50° C. to 300° C.

The processing chamber includes a transparent window. The heater is arranged outside of the processing chamber adjacent to the transparent window. The heater includes a plurality of light emitting diodes.

In other features, the heater is arranged inside of the processing chamber. Exposed surfaces of the heater are made of a non-metallic material or coated with a non-metallic coating. The heater includes at least one of embedded heaters and coolant channels.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1A:
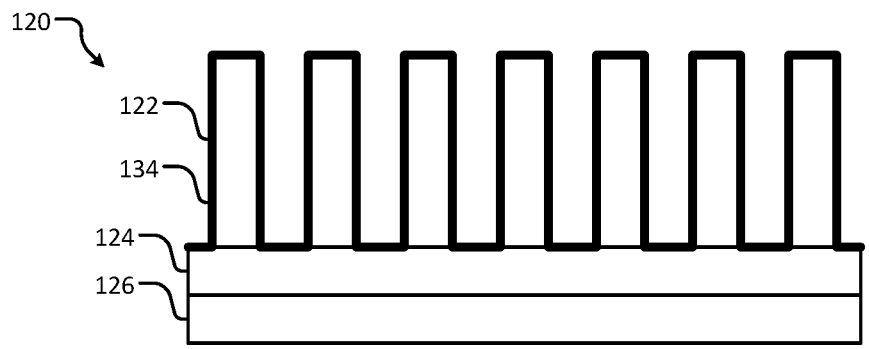
FIG. 1A is a cross-sectional view of an example of a substrate with high aspect ratio features prior to cleaning.

Metal contamination of substrates may be caused by upstream process chamber metals (UPCM) such as stainless steel (iron (Fe), chromium (Cr), nickel (Ni) and molybdenum (Mo)), chamber coatings such as yttrium (Y), and/or chamber body materials such as aluminum (Al). Contamination may also occur due to the presence of other metals: transition metals (such as titanium (Ti), vanadium (V), chromium (Cr), magnesium (Mn), iron (Fe), cobalt (Co), nickel (Ni), copper (Cu), zinc (Zn), yttrium (Y), zirconium (Zr), molybdenum (Mo), and tungsten (W)), alkali earth metals (such as magnesium (Mg) and calcium (Ca)), and alkali metals such as sodium (Na) and potassium (K).

Substrate cleaning systems and methods according to the present disclosure use a vapor mixture to clean substrates and remove metal contamination without leaving residues or causing collapse of HAR structures. As will be described further below, the vapor mixture converts metals to volatile metal compounds.

In some examples, the vapor mixture includes a metal chelating vapor. In some examples, the metal chelating vapor is selected from a group consisting of β-diketones and their derivatives. Examples of β-diketones include acetylacetone (acac), trifluoroacetylacetone (tfa), hexafluoroacetylacetone (hfacH), pivaloyltrifluoroacetone, tetramethylheptanedione and heptafluoro-dimethyl octanedione (fod). In other examples, the metal chelating vapor includes trifluoroacetic acid ($C_2HF_3O_2$) and ethylenediamine. Examples of derivatives of β-diketones include halogenated derivatives (e.g fluorinated derivatives such as trifluoroacetylacetone, hexafluoroacetylacetone, etc.).

Some of the metal chelating vapors such as hfacH are reactive to metals such as stainless steel. In some examples, surfaces of the substrate cleaning system that are exposed to the metal chelating vapor are made of non-metallic materials or coated with non-metallic coatings. For example, all of the components located in the processing chamber may be made of non-metallic materials or exposed surfaces of the components containing metals are coated with non-metallic coatings such as Teflon, silicon carbide, silicon or other suitable coatings.

In some examples, the substrate is heated to a predetermined temperature that is greater than 50° C. and less than 500° C. during cleaning. In some examples, the substrate is heated to a predetermined temperature that is greater than 50° C. and less than 300° C. during cleaning. In some examples, a heater is used to heat the substrate. In some examples, the heater is located outside of the processing chamber adjacent to a transparent window and optionally includes a light emitting diode (LED) heater. In some examples, the heater is located inside of the processing chamber and is optionally zoned. In some examples, chamber pressure is controlled during cleaning to a predetermined pressure range from 0.1 Torr to 100 Torr.

In some examples, a vapor mixture may further include another vapor including halogen species such as hydrogen fluoride (HF) vapor, hydrogen chloride (HCl) vapor, hydrogen bromide (HBr) vapor, hydrogen iodine (HI) vapor, etc. The halogen species vapor can be delivered along with the metal chelating vapor since they are generally chemically compatible. However, the metal chelating vapor and the halogen species vapor can be delivered to the processing chamber separately and/or used in the processing chamber during different periods.

In some examples, the substrate is treated with an oxidizing gas such as ozone ($O_3$) gas, molecular oxygen ($O_2$) gas, nitrous oxide (NO) gas, and the like. The oxidizing gas may be used to remove organic contamination. In some examples, the oxidizing gas is delivered before or after the vapor mixture is delivered to and/or used in the processing chamber to prevent decomposition of the metal chelating vapor and/or halogen species vapor.

In some examples, the cleaning systems and methods supply vapor that reacts with metal (which may also be in the form of a metal oxide or metal fluoride) to form volatile metal compounds at moderate process temperatures (<300° C.). In some examples, the vapor and metal compounds are relatively stable at these process temperatures. In some examples, the cleaning process is selective to Si-based materials.

β-diketones include a ketone group in the β-carbon position (e.g. acac, tfa, hfacH and fod). β-diketones are primarily present in the enol form. β-diketones function as a bi-dentate ligand to form volatile metal chelate complexes. Complexation between β-diketones and transition metals is derived from the availability of d-orbitals in these metals. Metal diketonates (and especially those formed from fluorinated β-diketones) have high vapor pressures.

Figure 1B:
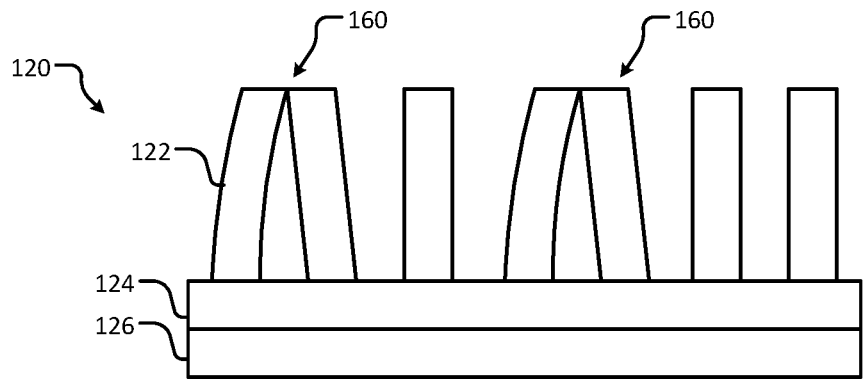
FIG. 1B is a cross-sectional view of an example of a substrate with high aspect ratio features having pattern collapse after wet cleaning.
Figure 1C:
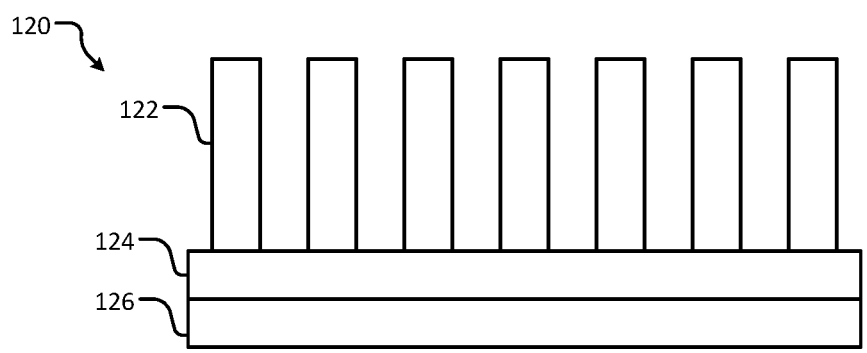
FIG. 1C is a cross-sectional view of an example of a substrate with high aspect ratio features without pattern collapse after cleaning using a vapor mixture according to the present disclosure.

Referring now to FIGS. 1A to 1C, a substrate 120 with high aspect ratio (HAR) features is shown. Prior to cleaning, the substrate 120 includes one or more underlying layers 124 and 126 as shown in FIG. 1A. HAR features 122 are arranged in spaced relationship on the underlying layer 124. An exposed layer (as shown by reference number 134) of the substrate 120 may be contaminated with metal and may need to be cleaned prior to performing downstream processing.

In FIG. 1B, the substrate 120 is shown after cleaning using a wet cleaning process. As can be seen, some of the HAR features 122 may experience pattern collapse (as shown at 160) after cleaning. In FIG. 1C, the substrate 120 is shown after cleaning using the vapor mixtures (and optional oxidizing gas mixtures) as described herein. The exposed layer 134 is removed without causing pattern collapse of the HAR features 122. As can be appreciated, while cleaning of HAR features 122 is shown, cleaning of other types of surfaces and/or features may also be performed.

Figure 2A:
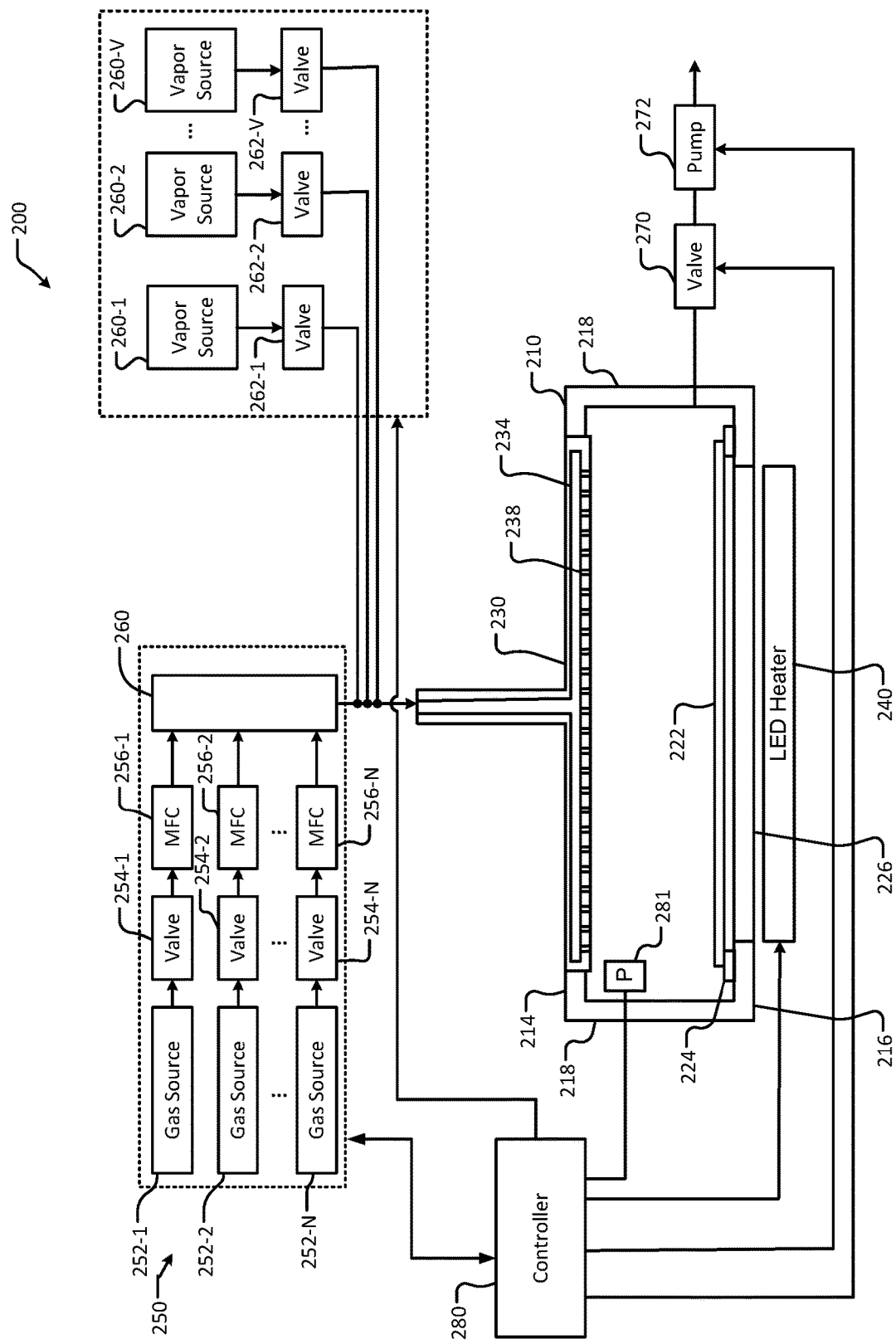
FIGS. 2A and 2B are functional block diagrams of examples of substrate processing systems for cleaning substrates according to the present disclosure.
Figure 2B:
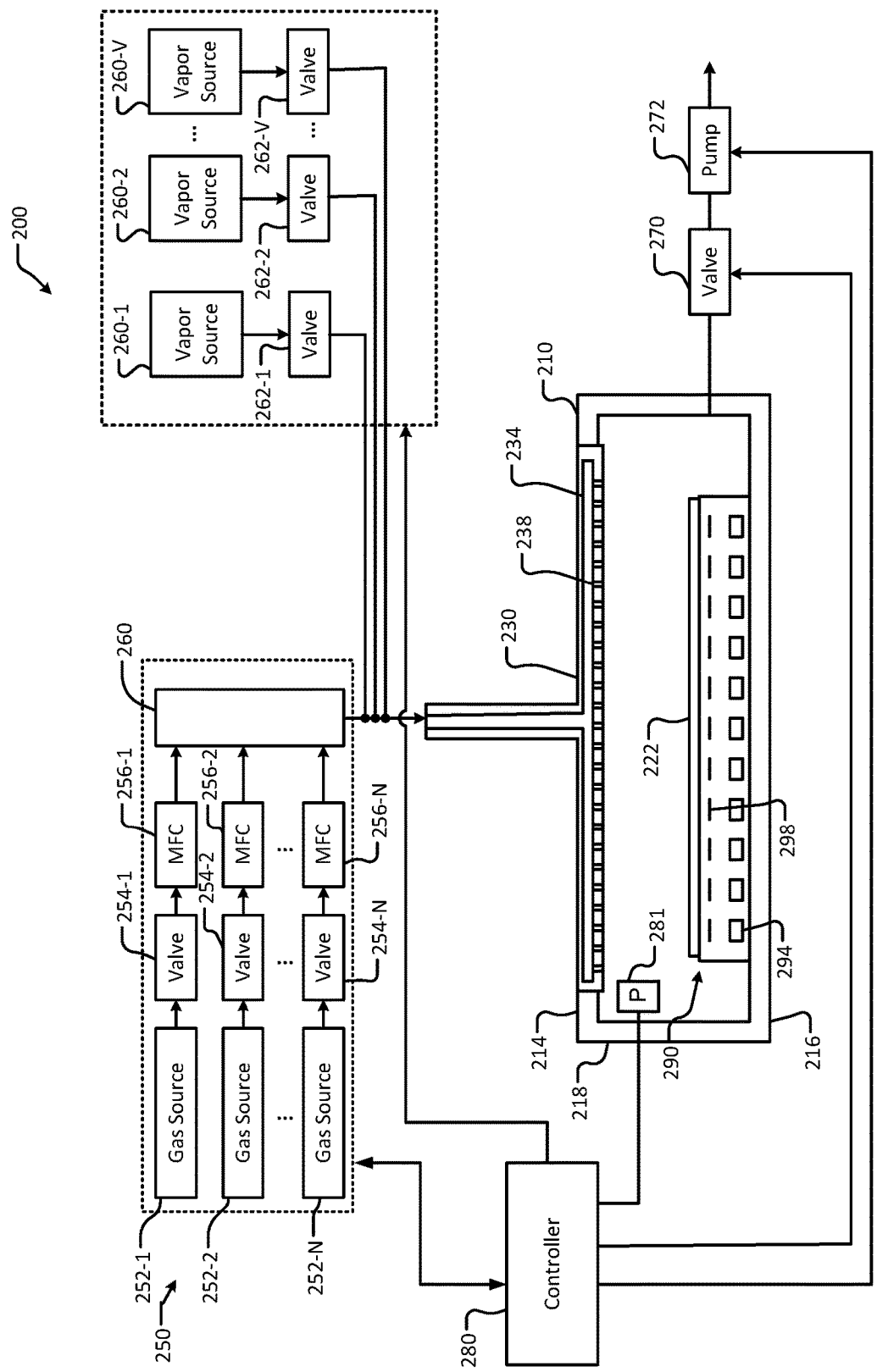

Referring now to FIGS. 2A and 2B, a substrate processing system 200 for cleaning substrates is shown. In FIG. 2A, the substrate processing system 200 includes a processing chamber 210 including a top surface 214, a bottom surface 216 and side walls 218. A substrate 222 is arranged inside of the processing chamber 210 during vapor cleaning. In some examples, the substrate 222 may be arranged on supports 224 that support a radially outer edge of the substrate 222. A window 226 is arranged along one surface of the processing chamber adjacent to one surface of the substrate 222. In some examples, the window 226 is optically transparent. In some examples, the window 226 is made of quartz. In some examples, exposed surfaces of components that are located within the processing chamber 210 and exposed to metal chelating vapor are made of nonmetallic materials. In some examples, these components are made of non-metallic materials, or are made of metal and coated with a non-metallic coating materials such as Teflon, silicon, or silicon carbide.

A showerhead 230 includes a gas plenum 234 and through holes 238. A vapor mixture flows into the gas plenum 234 and is distributed by the through holes 238. A heater 240 is arranged inside of or outside of the processing chamber 210. The heater 240 heats the substrate 222 to a desired temperature for processing. For example, a heated substrate support such as an electrostatic chuck, a pedestal or mechanical chuck is arranged inside of the processing chamber 210. Alternately, an infrared heater, a laser, flash lamp, an LED heater or other type of light-based heater can be arranged outside of the processing chamber 210 and the window 226 can be used.

A gas delivery system 250 may be used to supply one or more gases to the showerhead 230. For example, the gas delivery system 250 may be used to supply carrier gases, inert gases, oxidizing gases and the like. The gas delivery system 250 includes gas sources 252-1, 252-2, . . . , and 252-N (collectively gas sources 252), valves 254-1, 254-2, . . . , and 254-N (collectively valves 254), and mass flow controllers 256-1, 256-2, . . . , and 256-N (collectively mass flow controllers 252). A manifold 260 receives an output of the mass flow controllers 252. The manifold 260 is connected to the showerhead 230.

Vapor sources 260-1, 260-2, and 260-V (collectively vapor sources 260) supply vapor via valves 262-1, 262-2, and 262-V to the showerhead 230. In some examples, the vapor sources 260 include ampoules, bubblers or other vapor generators.

A valve 270 and a pump 272 may be used to remove reactants from the processing chamber 210 and/or to control pressure within the processing chamber 210.

A controller 280 may be used to control the timing of delivery of gases from the gas delivery system 250, heating of the substrate 222 by the heater 240, delivery of the vapor mixtures from the vapor sources 260, adjustment of pressure within the processing chamber 210 (e.g. via feedback from a pressure sensor 281), and/or removal of reactants via purging or evacuation.

As can be appreciated, when the vapor mixture includes more than a single vapor, the vapor mixture can be mixed prior to delivery and then delivered to the processing chamber. Alternately, the vapors in the vapor mixture can be delivered individually and mixed in the chamber. In other examples, the vapors are delivered separately to the processing chamber and not intermixed. In some examples, the oxidizing gas mixture is delivered separately from the metal chelating vapor mixture.

In FIG. 2B, a heater 290 can be located inside of the processing chamber 210. The heater 290 can include a single zone or multiple zones. In some examples, the heater 290 is made of non-metallic materials or made of metallic materials that are coated with non-metallic materials as described herein. The heater 290 can include coolant channels 294 and/or embedded heaters such as thermal control elements (TCEs), resistive heaters, Peltier heaters, etc.

Figure 3:
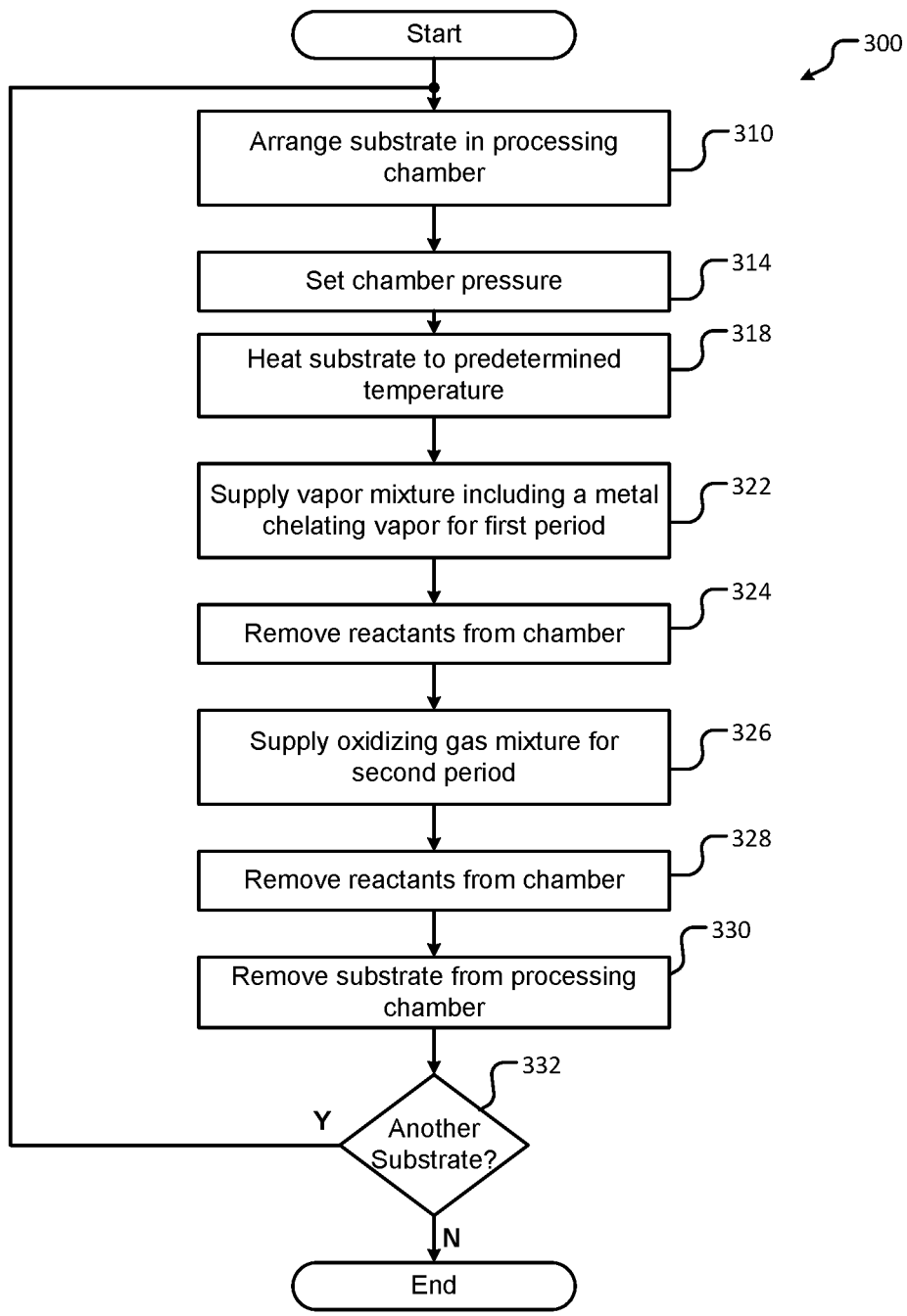
FIG. 3 is a flowchart of an example of a method for cleaning substrates using vapor according to the present disclosure.

Referring now to FIG. 3, a method 300 for cleaning substrates using vapor is shown. At 310, a substrate is arranged in the processing chamber. At 314, chamber pressure is set to a pressure in a predetermined pressure range. At 318, the substrate is heated to a temperature in a predetermined temperature range. At 322, a vapor mixture including a metal chelating vapor is supplied to the processing chamber for a first period. In some examples, a halogen species vapor is supplied with the metal chelating vapor or separately. At 324, reactants are removed from the processing chamber by purging or evacuation after the first period.

At 326, a gas mixture including an oxidizing gas is supplied to the processing chamber for a second period. At 328, reactants are removed from the processing chamber by purging or evacuation after the second period.

At 330, the substrate is removed from the processing chamber. At 332, the method determines whether another substrate is to be processed. If 332 is true, the method returns to 310. Otherwise, the method ends.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for cleaning a substrate, comprising:
   arranging the substrate in a processing chamber to clean the substrate using a cleaning process selective to silicon-based material without leaving residue and without collapsing high aspect ratio features on the substrate; and
   performing the cleaning process by:
   controlling a pressure of the processing chamber to a predetermined pressure range;
   controlling a temperature of the processing chamber to a predetermined temperature range;
   supplying a vapor mixture including a metal chelating vapor for a first period to remove metal contamination from surfaces of the substrate;
   after the first period, removing reactants from the processing chamber;
   supplying an oxidizing gas mixture to the processing chamber for a second period; and
   removing reactants from the processing chamber after the second period.

2. The method of claim 1, wherein at least one of:
   components that are located within the processing chamber are made of non-metallic materials; and/or
   exposed surfaces of the components that are located within the processing chamber are coated with a non-metallic coating.

3. The method of claim 2, wherein the metal chelating vapor includes β-diketones and derivatives of β-diketones.

4. The method of claim 1, wherein the metal chelating vapor is selected from the group consisting of acetylacetone (acac), trifluoroacetylacetone (tfa), hexafluoroacetylacetone (hfacH), pivaloyltrifluoroacetone, tetramethylheptanedione, and heptafluoro-dimethyl octanedione (fod).

5. A method for cleaning a substrate, comprising:
arranging the substrate in a processing chamber;
controlling a pressure of the processing chamber to a predetermined pressure range;
controlling a temperature of the processing chamber to a predetermined temperature range;
supplying a vapor mixture including a metal chelating vapor for a first period to remove metal contamination from surfaces of the substrate, wherein the metal chelating vapor includes trifluoroacetic acid and ethylenediamine;
after the first period, removing reactants from the processing chamber;
supplying an oxidizing gas mixture to the processing chamber for a second period; and
removing reactants from the processing chamber after the second period.

6. The method of claim 3, wherein the vapor mixture further includes a vapor including hydrogen halides.

7. The method of claim 1, further comprising:
prior to supplying the vapor mixture to the processing chamber, supplying an oxidizing gas mixture to the processing chamber for a second period; and
removing reactants from the processing chamber after the second period.

8. The method of claim 1, wherein the predetermined pressure range is from 0.1 Torr to 100 Torr.

9. The method of claim 1, wherein the predetermined temperature from 50° C. to 300° C.

10. The method of claim 1 further comprising controlling the temperature of the processing chamber using a heater arranged outside the processing chamber.

11. The method of claim 1, wherein the metal chelating vapor includes trifluoroacetic acid and ethylenediamine.

12. The method of claim 1, wherein the processing chamber comprises components having non-metallic surfaces.

* * * * *